United States Patent [19]

Black et al.

[11] Patent Number: 4,972,989

[45] Date of Patent: Nov. 27, 1990

[54] THROUGH THE LEAD SOLDERING

[75] Inventors: Brian J. Black, Elgin; Lisa M. Leding, Arlington Heights, both of Ill.

[73] Assignee: Motorola, Inc., Schaumburg, Ill.

[21] Appl. No.: 428,575

[22] Filed: Oct. 30, 1989

[51] Int. Cl.[5] .......................... B23K 1/20; B23K 31/02; B23K 101/36

[52] U.S. Cl. ..................................... 228/179; 228/248; 228/258; 228/180.2; 156/145

[58] Field of Search ...................... 228/179, 180.2, 190, 228/248, 254, 258; 156/145, 295

[56] References Cited

U.S. PATENT DOCUMENTS 3,294,951 12/1966 Olson ................................ 228/179
3,566,008 2/1971 Ettlinger et al. .................... 228/254
3,926,360 12/1975 Moister, Jr. .......................... 228/248
4,835,344 5/1989 Iyogi et al. ........................ 228/180.2
4,889,275 12/1989 Mullen, III et al. ............. 228/180.2

*Primary Examiner*—Nicholas P. Godici
*Assistant Examiner*—Samuel M. Heinrich
*Attorney, Agent, or Firm*—Anthony J. Sarli; Steven G. Parmalee; Joseph P. Krause

[57] ABSTRACT

A method of joining surface mount components includes screen printing a single layer of solder paste or other adhesive onto a substrate, positioning a component with a planar lead with a hole through the planar lead over the solder and mounting a second component over the hole in the first lead. The assembly is heated or otherwise processed until the solder or adhesive flows by capillary action through the hole and into the space between the components such that it forms solder joint between the stacked components.

16 Claims, 1 Drawing Sheet

10
50
42
D
A
t2
40
t1
20
30
B 50
30
40
42
30
20

THROUGH THE LEAD SOLDERING

BACKGROUND OF THE INVENTION

This invention relates to manufacturing techniques used to assemble electronic components on circuit boards. In particular, this invention relates to methods of assembling electric components, especially so-called surface mount devices on circuit boards or substrates such as alumina or other types of circuit boards.

Many electrical components, such as certain power transistors, have planar connection leads which are soldered onto conductive traces on a circuit board. To conserve space on the circuit board, additional components are frequently connected directly onto these planar connection leads.

When a planar connection lead from a device such as a transistor is to be soldered onto a circuit board and another component is to be soldered onto the planar connection lead, soldering an assembly of such components becomes difficult because the solder flowing between the layered pieces is difficult to control. Prior art methods of soldering these types of connections usually required that a layer of solder be deposited onto the substrate upon which the first component is positioned. A second layer of solder or solder paste might thereafter be deposited on the first component upon which the second component was then positioned. The assembly of pieces could then be heated as a unit until the solder flowed, which upon cooling, formed an electrically bonded assembly.

A method of joining components onto planar leaded components that reduces the number of steps required to produce a solder joint would be an improvement over the prior art. Such an improvement would preferably permit more accurate control over the amount of solder between the two components being joined together as well as the solder between the substrate and the planar connector surface.

SUMMARY OF THE INVENTION

There is provided herein a method of joining planar-leaded components to a substrate. The method requires that an assembly of parts be formed on a layer of solder paste onto the substrate. The first component, which is a planar-leaded component with at least a generally planar connection surface, has an orifice or hole, drilled or stamped through the planar connection surface. A hole must be present in the first component lead and be sized to draw molten solder through the hole.

The first component is placed over the solder paste. A second component, preferably having a planar connection surface that mates with the planar connection surface of the first component, is placed over the orifice through the first component.

After the components are assembled, the entire assembly is heated to at least the reflow temperature of the solder paste, until the solder paste melts and flows through the orifice. The amount of solder in the joint between the components is controlled by the thickness of the solder paste, the size and shape of the orifice, the composition of the solder, as well as the heating of the assembly.

The solder paste may be deposited on the substrate by screen printing or any other method allowing for accurate control of the thickness of the solder paste. The orifice in the planar component leads may be created by either drilling or stamping or punching as different applications require.

DETAILED DESCRIPTION OF THE PREFERRED EMBODIMENT

Figure 1:
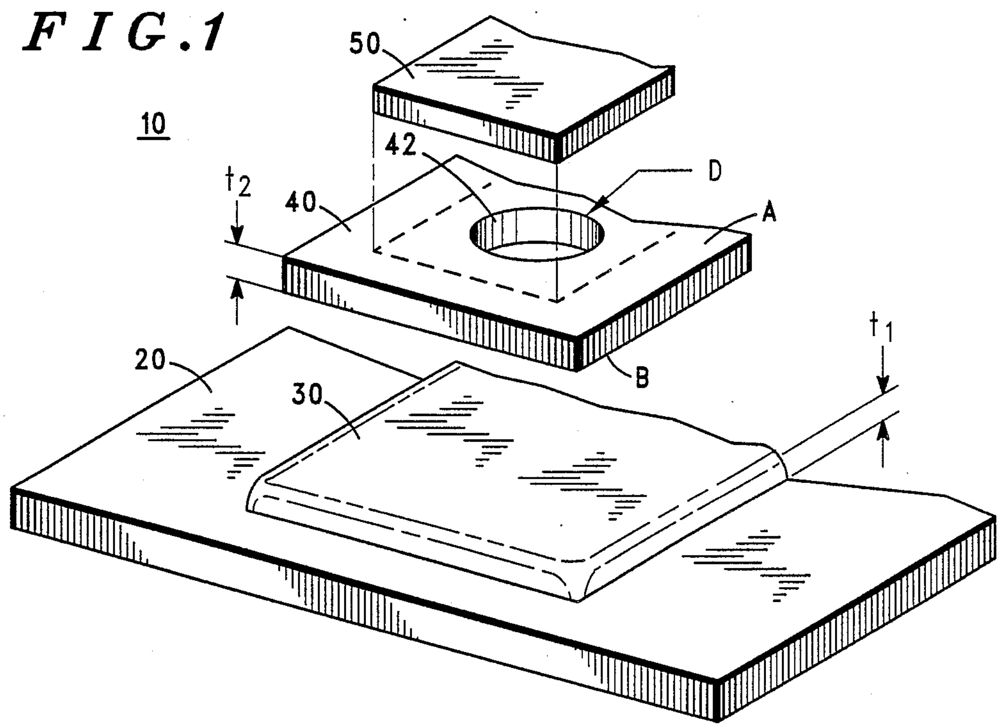
FIG. 1 shows an exploded isometric view of the elements of the solder connection.

FIG. 1 shows an exploded view of components of a solder joint (10) formed between planar-leaded components with solder drawn into the region between the planar mounting lead of a first component and a second component also having a substantially planar mounting surface. The solder joint (10) is formed on a substrate (20) which may be either a conventional printed circuit board, typically made of G-10 material or the like, or alumina. Any other suitable material could also be used. A layer of metal, such as a copper foil frequently used for printed circuits for example, can be deposited onto the substrate to carry electric currents to other circuits.

In the preferred embodiment a layer of solder paste (30) is deposited onto the substrate (20) having a predetermined thickness $t_1$ as shown. Adhesive other than solder paste might be used as well such as certain resins, conductive and heat-sensitive adhesives or other metals for example. In the preferred embodiment, the solder paste (30) is deposited onto the substrate (20) using screen printing, well known in the art.

A planar connection lead (40) from a component is positioned above the solder paste (30). (In the preferred embodiment, the lead (40) was from a component which was a planar leaded power transistor, TRW MPX286 for example, not shown.) The connection lead (40) is generally a metallic planar connection lead typically used to connect the component to metal surfaces or foil on the surface of the substrate (20). The planar connection lead shown (40) has two generally planar connection surfaces (A and B as shown) through which an orifice or hole (42) having a diameter, D extends. The hole (42) extends completely through the planar connection lead (40) and can be located virtually anywhere on the planar connection lead (40) subject to the limitation that the hole (42) be positioned somewhere over the solder paste (30) on the substrate and under any second component (50) to be soldered to the planar connection lead (40).

In the preferred embodiment the hole was sized to draw the molten solder through the hole (42) when the solder is molten. (It is believed that the molten solder is drawn through the hole (42) by capillary action although solder wettability or other characteristics of the solder might be responsible for the upward flow of the metal when it is molten.) The location of the hole (42) and its diameter (D) as well as the thickness $t_2$ of the planar connection lead must be selected so that when the solder paste is molten it freely flows upward through the hole (42) onto the upper surface (A) of the planar connection lead (40).

A second component, also a substantially planar connection surface (50) is placed over the hole (42). When the second connection surface (50) is physically in contact with the first connection surface (40) on surface A (with the first planar connection lead on the solder paste), the molten solder drawn through the hole will join the first and second surfaces when the solder cools.

The components of the assembly comprised of the substrate (20), the first planar connection surface (40) and the second connection surface (50) are normally heated together heated to the reflow temperature of the solder (the temperature at which the solder will melt). Upon melting, the solder paste should flow through the hole (42) into the space between the first and second planar connection leads (40 and 50) such that when the assembly cools the solder flowing into the space between the connection leads will bond the two leads together.

If other types of adhesives are used, such as conductive adhesives which require other types of processes, such as immersion into or mixture with solvents or other chemicals for example, the assembly of components might require heating. Similarly, the size of the hole (42) required to draw the adhesive through the hole when it is liquid or molten might also change.

Figure 2:
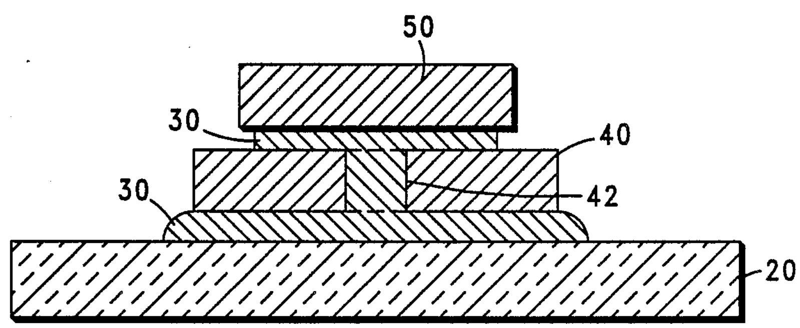
FIG. 2 shows a cross-sectional diagram of a solder joint between two components mounted on a substrate.

FIG. 2 shows an assembled connection on the substrate (20). Note that the solder (30) is shown within the hole (42) and between the first and second planar connection leads (40 and 50 respectfully). Note also that the features shown in FIG. 2 are not to scale, nor is the sizing of the hole (42). The diamemter of the hole must be such that the solder (30) flows vertically through the hole (42) up into the space between the connection leads (40 and 50).

In the preferred embodiment, the solder paste deposited onto the substrate (20) was approximately 10/1000'ths of an inch thick. The hole (42) was experimentally found to be usable between 25/1000'ths and 65/1,000'ths of an inch in diameter although other sizes might work as well depending on other factors described above.

The planar connection lead (40) in the preferred embodiment was a flat metal lead from a power transistor that had an average thickness of between 4/1000'ths and 6/1000'ths of an inch. The hole in the experimental units was drilled, although punching or stamping the planar connection lead (40) might produce an equally usable hole in the lead.

Although a circular or substantially circular hole geometry i shown, other shapes for the hole or orifice (42) might be equally usable. The orifice or hole (42) could be rectangular or square. It could be a slot or diamond shape or any other type of geometric figure subject to the limitation as above that the hole permit solder to be drawn upward into the space between the two connection leads when the solder is molten.

In the preferred embodiment, the second planar connection lead was a surface mount capacitor which was soldered onto the transistor lead. Other types of components other than surface mount components could be soldered together in this fashion avoiding the use of solder application at the site as though the joint.

What is claimed is:

1. A method of joining components having substantially planar connection leads to substrate comprising the steps of:

forming an assembly of parts by:

(A) depositing an adhesive, capable of flowing through an orifice after being processed, on the substrate;

(B) positioning on said adhesive a first component having a substantially planar connection lead with at least a first generally planar connection surface with an orifice through said planar connection lead through which processed adhesive may flow;

(C) mounting a second component on the first component, said second component having a second planar connection surface substantially mating with the first planar connection surface;

processing said adhesive until said adhesive flows through said orifice to between the first planar connection surface and the second planar connection surface.

2. The method of claim 1 where said orifice is sized to draw processed adhesive through said orifice.

3. The method of claim 1 where said adhesive is deposited on said substrate by screen printing.

4. The method of claim 1 where processed adhesive flows through said orifice by capillary action.

5. The method of claim 4 where said substrate is a circuit board.

6. The method of claim 5 where said first and second components are surface mounted components.

7. The method of claim 2 where said orifice is formed with a substantially circular cross-section.

8. The method of claim 2 where said orifice is formed with a substantially rectangular cross-section.

9. A method of joining components having substantially planar connection leads to a substrate comprising the steps of:

forming an assembly of parts by:

(A) depositing a solder paste on the substrate;

(B) positioning a first component, having a substantially planar connection lead with at least a first generally planar connection surface with an orifice through said planar connection lead through which molten solder may flow, on said solder paste;

(C) mounting a second component of the first planar connection surface, said second component having a second planar connection surface substantially mating with the first planar connection surface;

heating said assembly of parts to the reflow temperature of said solder paste until said solder paste melts and flows through said orifice to between the first planar connection surface and the second planar connection surface.

10. The method of claim 9 where said orifice is sized to draw molten solder through said orifice.

11. The method of claim 9 where said solder paste is deposited on said substrate by screen printing.

12. The method of claim 9 where molten solder flows through said orifice by capillary action.

13. The method of claim 12 where said substrate is a circuit board.

14. The method of claim 13 where said first and second components are surface mounted components.

15. The method of claim 10 where said orifice is formed with a substantially circular cross-section.

16. The method of claim 10 where said orifice is formed with a substantially rectangular cross-section.

* * * * *